(12) United States Patent
Roy et al.

(10) Patent No.: US 11,195,872 B2
(45) Date of Patent: Dec. 7, 2021

(54) LOW-NOISE WIDE DYNAMIC RANGE IMAGE SENSOR

(71) Applicant: STMicroelectronics (Crolles 2) SAS, Crolles (FR)

(72) Inventors: Francois Roy, Seyssins (FR); Stephane Hulot, Saint Martin d'Heres (FR); Andrej Suler, Grenoble (FR); Nicolas Virollet, Barraux (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 142 days.

(21) Appl. No.: 16/547,231

(22) Filed: Aug. 21, 2019

(65) Prior Publication Data

US 2020/0066780 A1   Feb. 27, 2020

(30) Foreign Application Priority Data

Aug. 24, 2018   (FR) ........................................ 1857634

(51) Int. Cl.
*H01L 27/146* (2006.01)

(52) U.S. Cl.
CPC .... *H01L 27/14643* (2013.01); *H01L 27/1461* (2013.01); *H01L 27/1463* (2013.01); *H01L 27/1464* (2013.01); *H01L 27/14612* (2013.01); *H01L 27/14636* (2013.01); *H01L 27/14621* (2013.01); *H01L 27/14627* (2013.01)

(58) Field of Classification Search
CPC ........... H01L 27/14643; H01L 27/1461; H01L 27/14612; H01L 27/1463; H01L 27/1464; H01L 27/14636; H01L 27/14621; H01L 27/14625; H01L 27/14627
See application file for complete search history.

(56) References Cited

U.S. PATENT DOCUMENTS

| | | | | |
|---|---|---|---|---|
| 8,513,761 | B2* | 8/2013 | Roy | H01L 27/1463 257/452 |
| 9,825,076 | B2* | 11/2017 | Roy | H01L 27/14645 |
| 10,153,312 | B2* | 12/2018 | Roy | H01L 27/14612 |
| 10,468,440 | B2* | 11/2019 | Saxod | H01L 27/14689 |
| 10,531,022 | B2* | 1/2020 | Roy | H01L 27/14614 |
| 2007/0029590 | A1* | 2/2007 | Rhodes | H01L 27/1463 257/291 |
| 2007/0052056 | A1* | 3/2007 | Doi | H01L 27/1463 257/462 |
| 2008/0083940 | A1* | 4/2008 | Ezaki | H01L 27/14643 257/292 |

(Continued)

FOREIGN PATENT DOCUMENTS

EP   1 995 783 A2   11/2008

*Primary Examiner* — John R Lee
(74) *Attorney, Agent, or Firm* — Seed IP Law Group LLP

(57) ABSTRACT

A semiconductor image sensor includes a plurality of pixels. Each pixel of the sensor includes a semiconductor substrate having opposite front and back sides and laterally delimited by a first insulating wall including a first conductive core insulated from the substrate, electron-hole pairs being capable of forming in the substrate due to a back-side illumination. A circuit is configured to maintain, during a first phase in a first operating mode, the first conductive core at a first potential and to maintain, during at least a portion of the first phase in a second operating mode, the first conductive core at a second potential different from the first potential.

20 Claims, 4 Drawing Sheets

(56) References Cited

U.S. PATENT DOCUMENTS

| | | | |
|---|---|---|---|
| 2008/0173963 A1* | 7/2008 | Hsu | H01L 27/1464 |
| | | | 257/431 |
| 2008/0290382 A1* | 11/2008 | Hirota | H01L 27/14627 |
| | | | 257/291 |
| 2009/0184317 A1* | 7/2009 | Sanfilippo | H01L 31/107 |
| | | | 257/49 |
| 2010/0127314 A1* | 5/2010 | Frach | H01L 31/103 |
| | | | 257/292 |
| 2010/0193845 A1* | 8/2010 | Roy | H01L 27/1463 |
| | | | 257/228 |
| 2012/0018618 A1* | 1/2012 | Roy | H01L 27/14603 |
| | | | 250/208.1 |
| 2017/0186789 A1* | 6/2017 | Roy | H01L 27/14687 |
| 2017/0353673 A1* | 12/2017 | Roy | H01L 27/14643 |
| 2018/0047770 A1* | 2/2018 | Roy | H01L 27/1463 |
| 2018/0158860 A1* | 6/2018 | Roy | H01L 27/14634 |
| 2018/0278863 A1* | 9/2018 | Roy | H01L 27/14643 |
| 2018/0315784 A1* | 11/2018 | Saxod | H01L 27/1461 |
| 2019/0237499 A1* | 8/2019 | Roy | H01L 27/14641 |
| 2020/0066780 A1* | 2/2020 | Roy | H01L 27/14614 |
| 2020/0098799 A1* | 3/2020 | Tsai | H01L 27/14687 |
| 2021/0074749 A1* | 3/2021 | Dalleau | H01L 27/14689 |

* cited by examiner

LOW-NOISE WIDE DYNAMIC RANGE IMAGE SENSOR

CROSS-REFERENCE TO RELATED APPLICATION

This application claims the priority benefit of French patent application number 18/57634, filed on Aug. 24, 2018, the content of which is hereby incorporated by reference in its entirety to the maximum extent allowable by law.

BACKGROUND

Technical Field

The present disclosure concerns an image sensor including a pixel array and more particularly a pixel of such an image sensor.

Description of the Related Art

It is known to those skilled in the art to form a pixel including a photodiode where charges form due to illumination, the charges being stored in a region of the photodiode, to be transferred by a MOS transistor towards a sense node. In the case where the image sensor is capable of operating both in strong illumination conditions and in low illumination conditions, it may be necessary to provide two photodiodes, the first photodiode having a high sensitivity adapted to low illumination conditions and the second photodiode having a low sensitivity adapted to strong illumination conditions. This results in complex pixel structures.

BRIEF SUMMARY

There is a need for an image sensor having pixels with a simple structure, which may be used in strong illumination conditions and in low illumination conditions.

Embodiments of the present disclosure overcome all or part of the disadvantages of known image sensors.

An embodiment provides a semiconductor image sensor, each pixel of the sensor including a semiconductor substrate having opposite front and back sides and laterally delimited by a first insulating wall including a first conductive core insulated from the substrate, electron-hole pairs being capable of forming in the substrate due to a back-side illumination, and a circuit configured to maintain, during a first phase in a first operating mode, the first conductive core at a first potential and to maintain, during at least a portion of the first phase in a second operating mode, the first conductive core at a second potential different from the first potential.

According to an embodiment, the substrate is of a first conductivity type and of a first doping level, each pixel of the sensor further including a second insulating wall penetrating into the substrate from the front side of the substrate, the second insulating wall being ring shaped and delimiting a substantially central region including a lower portion continuing the substrate and an upper portion of the first conductivity type having a second doping level greater than the first doping level, the second wall including a second conductive core insulated from the region, the circuit being configured to maintain, during the first phase, the second conductive core at a third potential. In the first phase, the charge transfer from the substrate to the upper portion is blocked and, during a second phase, the second conductive core is maintained at a fourth potential, which results in a charge transfer from the substrate to the upper portion, and to maintain, during the first phase in the first operating mode, the first conductive core at the first potential which is equal to the third potential and to maintain, during the at least a portion of the first phase in the second operating mode, the first conductive core at the second potential which ranges from the third potential, not included, to the fourth potential.

According to an embodiment, the first portion is at the first doping level.

According to an embodiment, each pixel further includes an area penetrating into the substrate from the front side less deeply than the second insulating wall.

An embodiment also provides a method of controlling a semiconductor image sensor, each pixel of the sensor including a semiconductor substrate having opposite front and back sides and laterally delimited by a first insulating wall including a first conductive core insulated from the substrate, electron-hole pairs being capable of forming in the substrate due to a back-side illumination, the method including:

maintaining during a first phase in a first operating mode the first conductive core at a first potential; and maintaining, during at least a portion of the first phase in a second operating mode, the first conductive core at a second potential different from the first potential.

According to an embodiment, the substrate is of a first conductivity type and has a first doping level, each pixel of the sensor further including a second insulating wall penetrating into the substrate from the front side of the substrate, the second insulating wall being ring shaped and delimiting a substantially central region including a lower portion continuing the substrate and an upper portion of the first conductivity type having a second doping level greater than the first doping level, the second wall including a second conductive core insulated from the region, the method including:

maintaining, during the first phase, the second conductive core at a third potential, whereby the charge transfer from the substrate to the upper portion of is blocked;

maintaining, during a second phase, the second conductive core at a fourth potential, which results in a charge transfer from the substrate to the upper portion;

maintaining, during the first phase in the first operating mode, the first conductive core at the first potential which is equal to the third potential; and maintaining, during the at least a portion of the first phase in the second operating mode, the first conductive core at the second potential which ranges from the third potential, not included, to the fourth potential.

According to an embodiment, the passing from the first operating mode to the second operating mode depends on the illumination conditions of the image sensor.

According to an embodiment, the method further includes maintaining, during at least another portion of the second phase in the second operating mode, the first conductive core at the first potential which is equal to the third potential.

The foregoing and other features and advantages will be discussed in detail in the following non-limiting description of specific embodiments in connection with the accompanying drawings.

DETAILED DESCRIPTION

Figure 1:
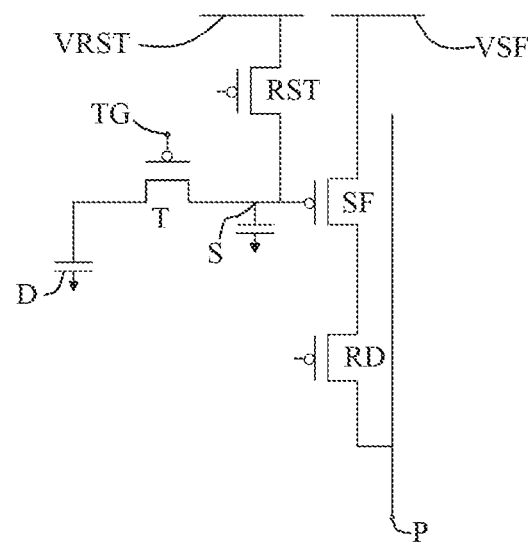
FIG. 1 illustrates a pixel circuit according to an embodiment of the present disclosure.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the circuits processing the signals supplied by the pixels of an image sensor and the circuits controlling the transistors of the pixels of an image sensor are well known and will not be described in detail.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, the term is with reference to the orientation in the drawings.

The terms "about", "substantially", and "approximately" are used herein to designate a tolerance of plus or minus 10%, preferably of plus or minus 5%, of the value in question. Further, unless otherwise specified, the term "conductive" means "electrically conductive", the term "insulating" means "electrically insulating" and the term "insulated" means "electrically insulated".

FIG. 1 shows of an electric circuit of a pixel of an image sensor according to an embodiment of the present disclosure.

A region D of storage of charges originating from photon capture is connected to a sense node S by a P-channel transfer transistor T having its gate connected to a node TG. A readout circuit includes a P-channel MOS precharge transistor RST, interposed between a power supply rail VRST and sense node S, and two series-connected P-channel MOS transistors SF and RD. The source of transistor SF is connected to a power supply rail VSF, which may correspond to power supply rail VRST. The drain of transistor RD is connected to a node P, itself connected to a processing circuit (not shown). The gate of readout transistor SF, assembled as a source follower, is connected to sense node S. Generally, the control signals of transistors T, RD, and RST are supplied by one or a plurality of control circuits (not shown) of the image sensor and may be supplied to all the pixels of a same row of the sensor pixel array.

In operation, the pixel receives an illumination and stores charges photogenerated in region D during an integration phase, transistor T then being in the off state. The pixel is read during a readout phase. The readout phase includes an operation of transferring the photogenerated charges from storage region D to sense node S by setting transistor T to the on state, and an operation of reading of the potential of sense node S by the readout circuit. This potential is representative of the quantity of charges photogenerated during the integration phase and forms an output signal of the pixel.

Figure 2:
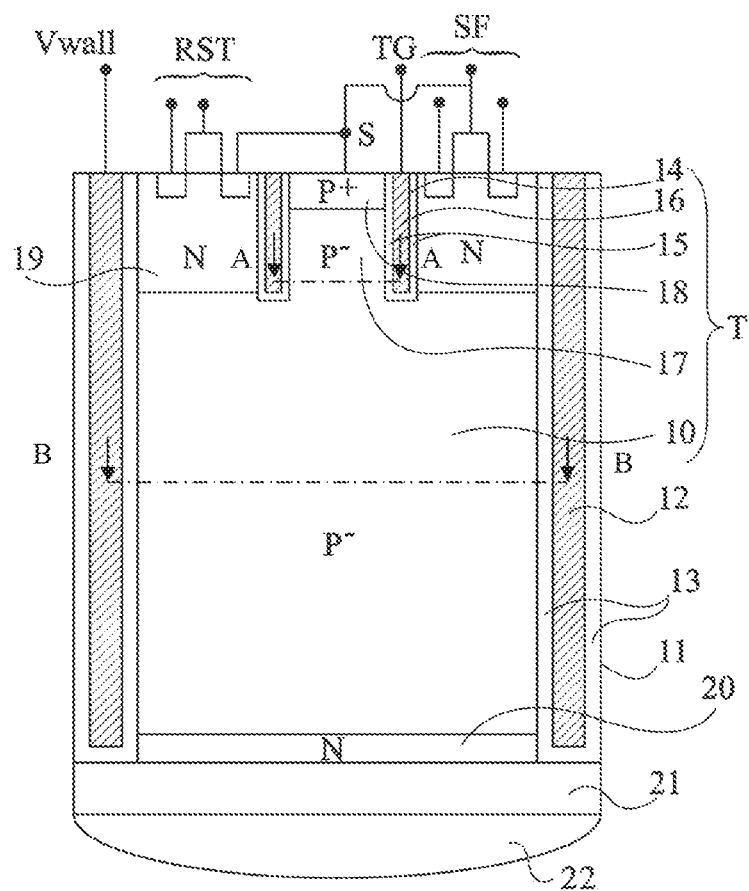
FIG. 2 is a cross-sectional view of an embodiment of a back-side illuminated pixel corresponding to the pixel circuit of FIG. 1 according to an embodiment of the present disclosure.
Figure 7:
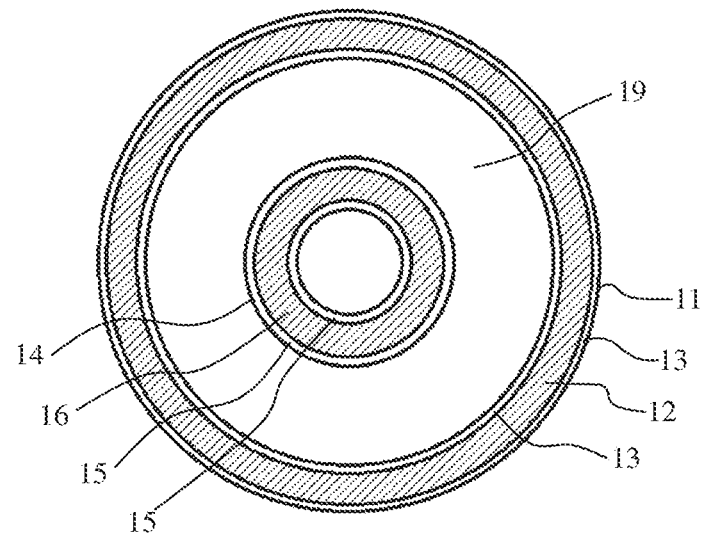
FIG. 7 is a top view of the pixel of FIG. 2.

FIG. 2 is a cross-sectional view of an embodiment of an image sensor having a circuit equivalent to that shown in FIG. 1 and FIG. 7 is a top sectional view of FIG. 2 along line A-A.

The pixel includes a lightly-doped P-type silicon substrate 10 (P−) laterally delimited by a wall 11, with the wall 11 including a conductive core 12, insulated from substrate 10 by an insulating wall 13 and coupled to a node Vwall. On the front or upper surface side of the pixel and in a substantially central area of the pixel, transfer transistor T includes an insulated electrode 14 including a vertical ring-shaped core 16 insulated by an insulating layer 15, as seen in FIG. 7. An interconnection structure, not shown, rests on the front side of the pixel and connects conductive core 16 to node TG. Electrode 14 laterally delimits a region including a lower lightly P-type doped portion 17 (P−) of the substrate 10, and an upper heavily-doped P-type portion 18 (P+). Upper portion or charge collection area 18 is directly connected to node S by the interconnection structure. Lower portion or transfer area 17 extends from charge collection area 18 down to a depth substantially equal to or smaller than that of electrode 14. An N-type doped region 19 penetrates into substrate 10 down to a depth smaller than or substantially equal to that of insulated vertical electrode 14. Region 19 may have various transistors formed therein, for example, transistors RD (not shown), RST, and SF of the pixel readout circuit. An N-type doped layer 20 is arranged at the lower surface level of substrate 10. Further, the rear or lower surface of the pixel may be covered with a color filter 21 and with a lens 22. The precharge and readout transistors may be common to a plurality of neighboring cells, for example to a group of four cells. Various metallization levels are formed on the upper surface, to ensure the connections to the drains, sources, and gates of the various transistors. In particular, an interconnect corresponding to sense node S of FIG. 1 is provided between P+ region 18, the drain of precharge transistor RST, and the gate of follower transistor SF.

According to an embodiment, the doping level of substrate 10 may be in the range from $10^{14}$ atoms/cm$^3$ to $10^{16}$ atoms/cm$^3$. The height of substrate 10, measured between the upper surface and the lower surface of the substrate, may be smaller than 10 µm, preferably in the range from 2.5 µm to 5 µm, for example, approximately 4 µm. According to an embodiment, the pixel is a back-side illuminated device, that is, substrate 10 will have initially formed the upper portion of a thick silicon substrate, possibly the upper silicon layer of a structure of silicon-on-insulator type (SOD. Further, the width of substrate 10, that is, the minimum distance between walls 11 may vary from 0.5 µm to 5 µm, and may for example be approximately 1.4 µm. The width of lower portion 17 may vary from 0.1 µm to 0.5 µm, and for example be approximately 0.3 µm. According to an embodiment, the doping level of upper portion 18 may be in the range from $5*10^{19}$ atoms/cm$^3$ to $5*10^{20}$ atoms/cm$^3$. The width of core 12 may vary from 0.1 µm to 0.2 µm, and may for example be approximately 0.15 µm. The width of electrode 16 may vary from 0.1 µm to 0.2 µm, and may for example be approximately 0.18 µm. The height of electrode 16 may vary from 0.5 µm to 1.5 µm, and may for example be approximately 1 µm. The thickness of each insulating layer 13, 15 may vary from 0.01 µm to 0.1 µm, and may for example be approximately 0.02 µm.

The operation of the pixel shown in FIG. 2 includes a photoconversion phase, also called integration phase, and a transfer phase. During the integration phase, the back side is illuminated and charges are photogenerated and are stored in substrate 10. In the present embodiment, substrate 10 is P-type doped so that the charges which are stored in substrate 10 are holes. Thus, substrate 10 corresponds to storage region D of the circuit of FIG. 1 and forms a photosensitive area designated, like the substrate, with reference numeral 10. During the integration phase, transistor T is in the off state. During the transfer phase, the photogenerated charges are transferred from substrate 10 to layer 18 and to sense node S. Transistor T is set to the on state during the transfer phase.

Layer 20 has a function of inversion of the type of majority carriers contained in substrate 10. As a variation, such an inversion of the concentration of the carrier type may also be achieved by a MOS capacitor on the back side provided with an electrode (metallic, semiconductor, or dielectric), transparent in the useful sensitivity spectrum of the sensor, which creates a free carrier inversion channel (MOS effect).

According to an embodiment, each pixel may be controlled according to one or the other of a first operating mode and of a second operating mode according to the image sensor illumination conditions. The first and second operating modes particularly differ by the potential applied to node Vwall during the integration phase.

Figure 3:
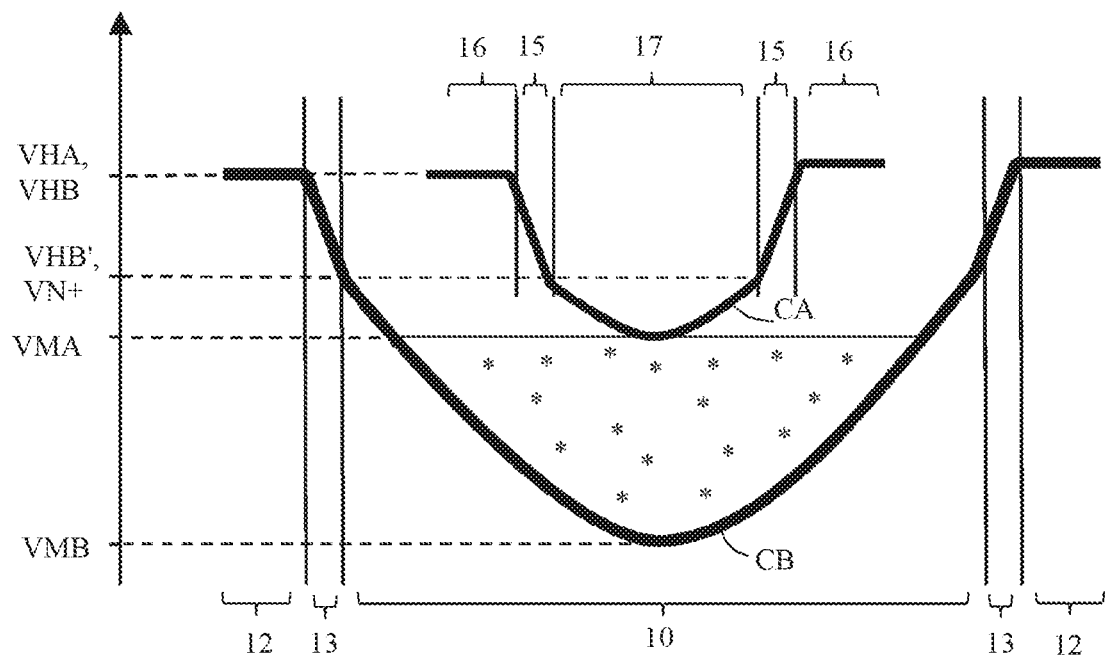
FIG. 3 shows curves of the variation of the electrostatic potential along cross-sectional lines of the pixel of FIG. 2 in a first operating mode.
Figure 4:
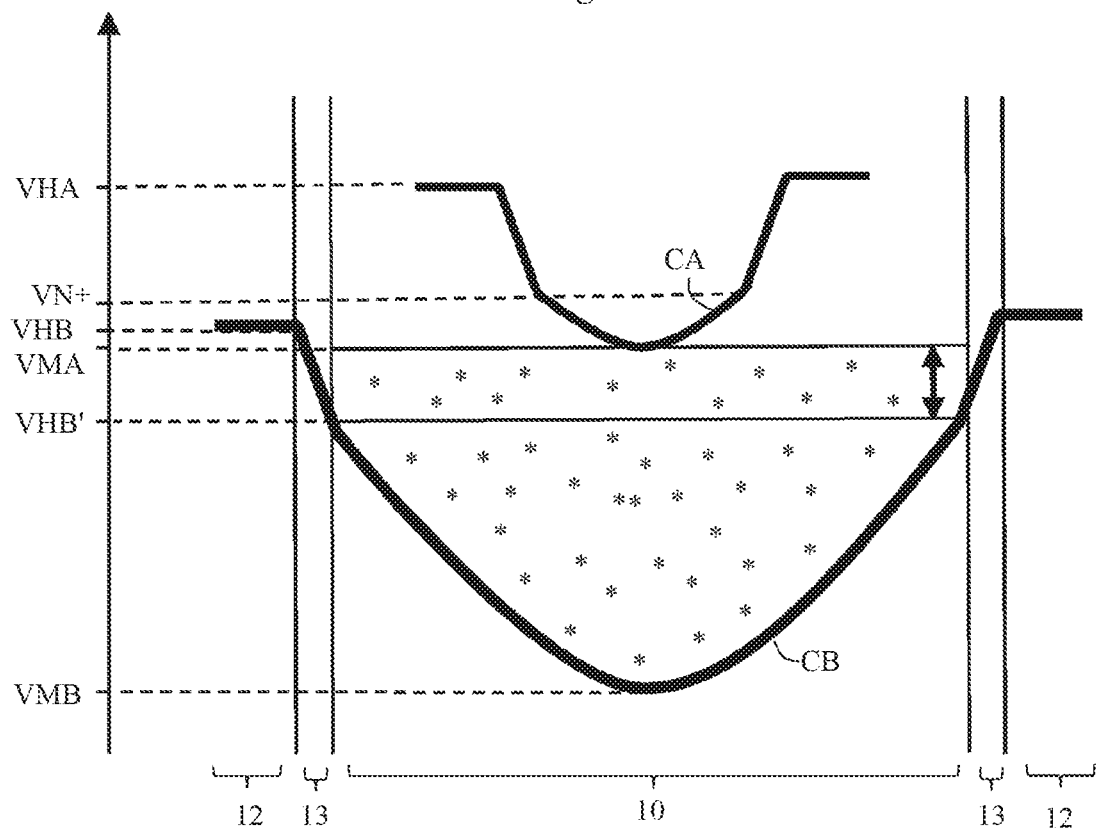
FIG. 4 shows curves of the variation of the electrostatic potential along cross-sectional lines of the pixel of FIG. 2 in a second operating mode.

FIGS. 3 and 4 each illustrate potential variation curves CA and CB of the electrostatic potentials in the pixel of FIG. 2 respectively along lines A-A and B-B at the beginning of the integration phase for the first operating mode in FIG. 3 and for the second operating mode in FIG. 4.

As previously described, during the integration phase, the conduction between substrate 10 and heavily-doped P type region 18 is interrupted by an action on control node TG coupled with conductive core 16 of insulated conductive electrode 14. Indeed, if conductive core 16 is set to a positive potential VHA, region 17 is fully depleted of holes and the passing of charge carriers is inhibited by the potential barrier thus created between region 17 and substrate 10. Thus, region 17 plays the role of a channel region of transistor T and region 18 corresponds to the source region of this transistor connected to sense node S. According to an embodiment, potential VHA is in the range from 2 V to 5 V, for example, equal to 3.3 V or 3.5 V.

At the beginning of an integration phase, substrate 10 corresponds to a potential well having its shape set by potential VHB imposed on conductive core 12 in insulating wall 11 and the doping of P– area 10. As shown in FIGS. 3 and 4, the potential variation well CB has a general upside-down bell shape, having its minimum positive potential VMB substantially at the same distance from insulating layers 13. Along the line B-B (FIG. 2), the potential of substrate 10 increases from potential VMB towards the surface of insulating layer 13, oriented towards substrate 10, which is at a potential VHB'. Potential VHB' is smaller than potential VHB and is controlled by potential VHB of conductive core 12 and potential VN+ of N-doped area 19 in the first operating mode and is only controlled by potential VHB of conductive core 12 in the second operating mode. Potential VHB' is substantially equal to VN+ in the first operating mode. Potential VHB' is smaller than potential VN+ in the second operating mode.

During the integration phase, potential VMB progressively increases while holes, represented by stars, are stored in substrate 10. Potential VHA on conductive core 15 of electrode 14 is such that central region 17 is fully depleted and that its minimum potential VMA is greater than minimum potential VMB of substrate 10 in the absence of photogenerated charges. As long as the potential of substrate 10 remains smaller than the potential of region 17, holes cannot transit towards region 18 of high doping level P+, region 18 being at a low potential, close to 0 V. If, due to the hole storage, the potential in substrate 10 reaches potential VMA of region 17, the excess holes may transit towards region 18 and are discharged into the drain area. This forms an antiblooming protection. The maximum quantity of charges capable of being stored in substrate 10 thus depends on the difference between potentials VMA and VMB.

According to the first operating mode, during the integration phase, potential VHB applied to conductive core 12 of insulating wall 11 is substantially equal to potential VHA. Potential VHB' is then coupled to potential VN+ so that, during all the integration phase, electrons line the side of wall 11. The dark current due to the generation of holes at the interface between substrate 10 and wall 11 is then decreased.

According to the second operating mode, during the integration phase, potential VHB applied to conductive core 12 of insulating wall 11 is smaller than potential VHA so that electrostatic potential VHB' is smaller than potential VMA. The photogenerated holes will fill the potential well and be stored up to the interface of storage area 10 and of electrode 13 to reach potential VMA. However, the difference between potentials VMA and VMB in the second operating mode is greater than the difference between potentials VMA and VMB in the first operating mode and the hole storage capacity at the surface (in the second operating mode) is much greater than the volume hole storage capacity (in the first operating mode). Advantageously, the maximum quantity of charges that can be stored by substrate 10 in the second operating mode is greater than the maximum quantity of charges that can be stored by substrate 10 in the first operating mode. The difference between the maximum quantity of charges that can be stored by substrate 10 in the second operating mode and the maximum quantity of charges that can be stored by substrate 10 in the first operating mode depends on the difference between potential VMA and potential VHB'. The second operating mode is thus particularly adapted to strong illumination conditions.

However, in the second operating mode, during the integration phase, when potential VHB' in substrate 10 is smaller than the potential of N-doped region 10 (well of the readout transistors), electrons are not stored along the sides of walls 11. Thereby, the dark current in the second operating mode is higher than in the first operating mode. The first operating mode is thus particularly adapted to low illumination conditions.

According to an embodiment, in the second operating mode, potential VHB is smaller than 3 V and greater than 0 V, preferably smaller than 2.5 V, for example, equal to approximately 2 V.

Figure 5:
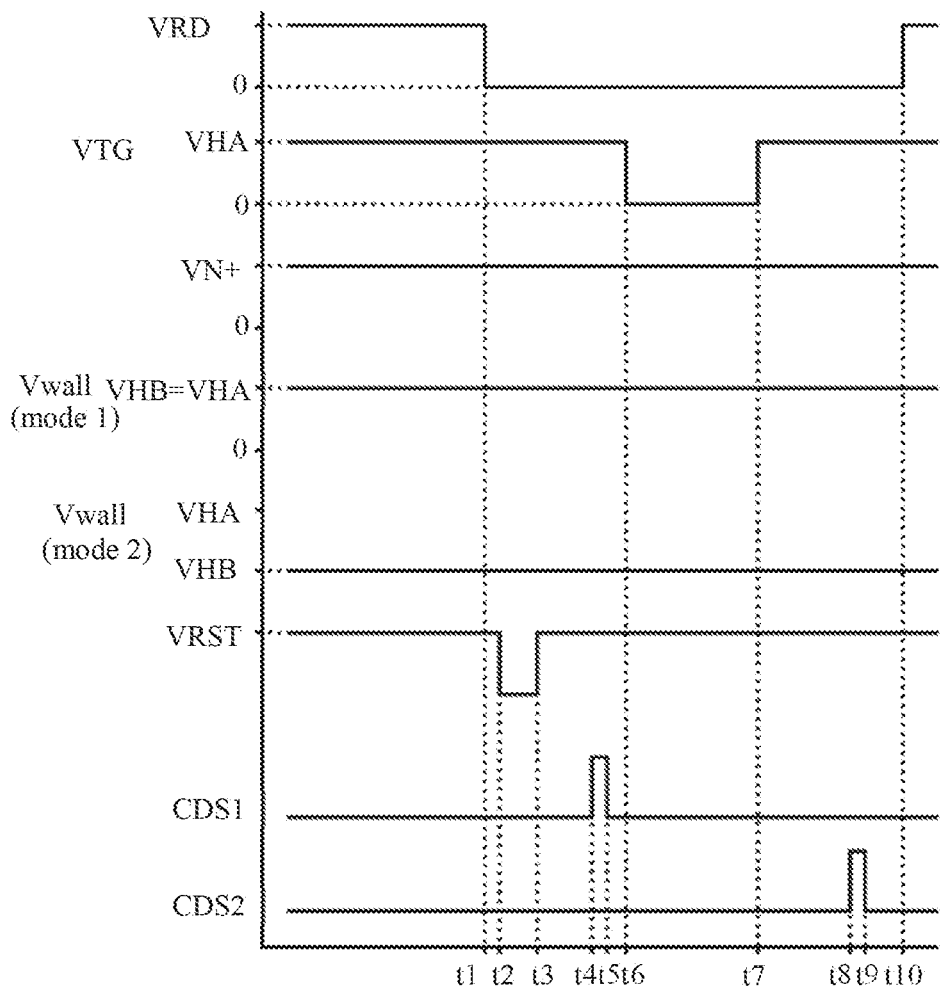
FIG. 5 shows a timing diagram of operating signals of the pixel of FIG. 2 in an embodiment of the first and second operating modes.
Figure 6:
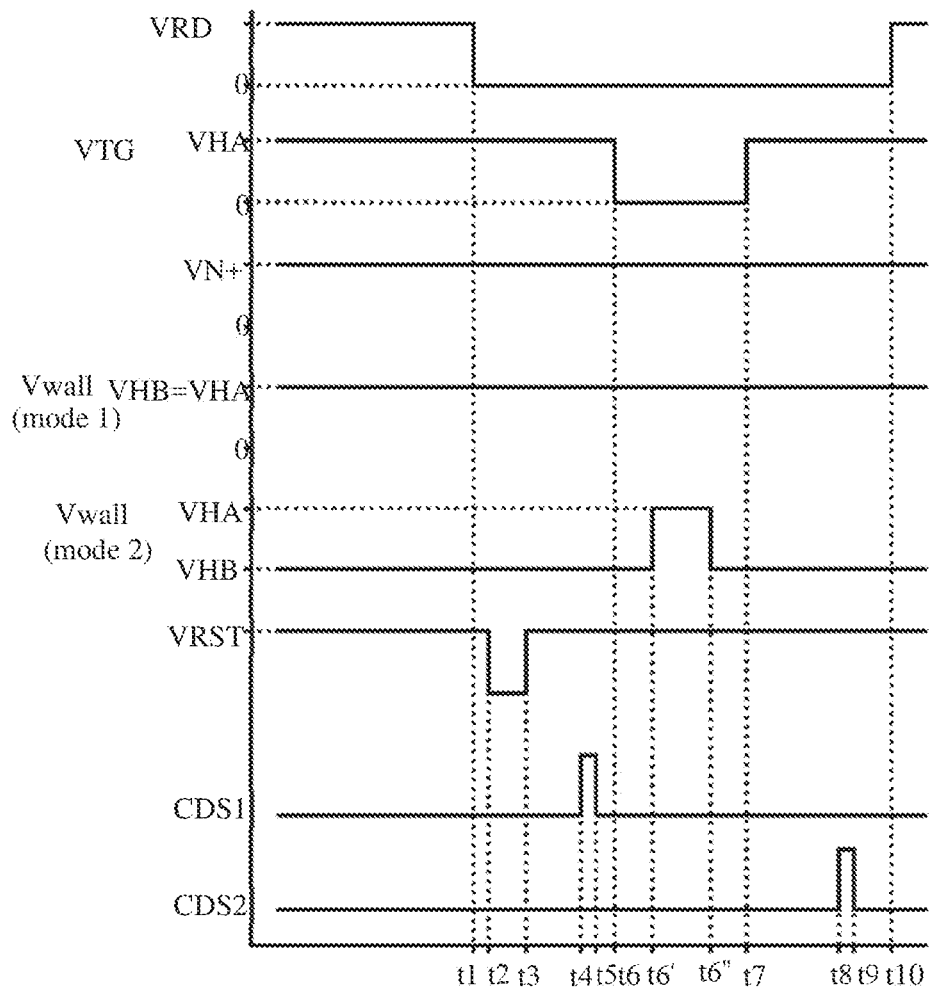
FIG. 6 shows a timing diagram of operating signals of the pixel of FIG. 2 in another embodiment of the first and second operating modes.

FIGS. 5 and 6 show timing diagrams of operating signals of the pixel of FIG. 2 for two embodiments of the first and second operating modes during a readout cycle. Times t1 to t10 are successive times. For the first and second operating modes, regions 19 are maintained at potential N+, for example, equal to 2.5 V for the entire duration of the cycle.

A readout cycle starts at time t1 by the turning-off of transistor RD (potential VRD applied to the gate of transistor RD in the off state is a low value) and ends at time t10 by the turning-on of transistor RD (potential VRD applied to the gate of transistor RD in the on state is a high value). At the beginning of the readout cycle, at time t1, transistors RST and T are non-conductive. The potential VRST applied to the gate of transistor RST is thus at a high value. Further, the potential VTG applied to the gate of transistor T is equal to VHA. Charges are photogenerated in the pixel and stored in substrate 10.

Between times t2 and t3, transistor RST is on (signal VRST in the low state) so that the potential of sense node S is initialized at a first value. Between times t4 and t5, the potential of node P, which is representative of the first value of the potential at sense node S, is read out, which is illustrated in FIGS. 5 and 6 by control CDS1 of an N-channel MOS transistor of the readout circuit coupled to node P which switches to the high state between times t4 and t5. Between times t6 and t7, transistor T is on (signal VTG in the low state) so that the charges stored in substrate 10 are transferred to sense node S. The potential of sense node S varies from the first value to a second value. Between times t8 and t9, the potential at node P, which is representative of the second value of the potential at sense node S, is read out, which is illustrated in FIGS. 5 and 6 by control CDS2 of an N-channel MOS transistor of the readout circuit coupled to node P, which switches to the high state between times t8 and t9. The readout circuit can thus determine the difference between the first and second values. The readout cycle ends at time t10 by the turning-on of transistor RD.

In the first operating mode, for the entire duration of the cycle, the potential Vwall applied to conductive core 12 of wall 11 is maintained at VHB, which is equal to VHA, for example, equal to 3.3 V. In the embodiment of the second operating mode illustrated in FIG. 5, for the entire duration of the cycle, the potential Vwall applied to conductive core 12 of wall 11 is maintained at VHB, which is smaller than VHA, for example, equal to 2 V. In the embodiment of the second operating mode illustrated in FIG. 6, for the entire duration of the cycle except during successive times t6' and t6", located between times t6 and t7, the potential Vwall applied to conductive core 12 of wall 11 is maintained at VHB, which is smaller than VHA, for example, equal to 2 V. Between times t6' and t6", that is, during the transfer of the charges stored in substrate 10 to sense node S, potential Vwall may be temporarily increased to value VHA, for example, 3.3 V, to improve the charge transfer.

The switching from the first operating mode to the second operating mode and conversely, particularly for the embodiments illustrated in FIGS. 5 and 6, may be achieved based on an analysis of the illumination received by the pixel. According to an embodiment, when the pixel is in the first operating mode and the light intensity detected by the pixel increases beyond a threshold, which means that the pixel is in strong luminosity conditions, there is a switching from the first operating mode to the second operating mode. According to an embodiment, when the pixel is in the second operating mode and the detected light intensity of the pixel decreases below a threshold, which means that the pixel is in low luminosity conditions, there is a switching from the second operating mode to the first operating mode. The same pixel structure may thus be used both in strong illumination conditions and in low illumination conditions.

Various embodiments and variations have been described. It will be understood by those skilled in the art that certain features of these various embodiments and variations may be combined, and other variations will occur to those skilled in the art. In particular, the previously described embodiments concern a pixel structure adapted to the forming of an image sensor of rolling shutter type since the transfer operation and the readout operation are carried out for all the pixels of a row before being successively formed for the other pixel rows of the array. However, these embodiments may also be implemented for an image sensor of global shutter type. For such an image sensor, each pixel generally includes an additional transistor between transistor T and the gate of transistor SF, in series with transistor T, the previously-described sense node S corresponding to the node between the additional transistor and transistor SF and the node between transistor T and the additional transistor corresponding to a memory cell. The operation of charge transfer towards the memory cell is carried out simultaneously for all the pixels of the array, which enables to memorize a full image in all the memory cells of the sensor. Once the transfer operation has been performed, transistor T is set back to the off state and a new integration phase may start while the readout phase carries on. The readout phase then includes an additional transfer operation during which the additional transistor is set to the on state to transfer the charges stored in the memory cell to sense node S. In the same way as in a sensor of rolling shutter type, the potential of node S is then read out during a readout operation. The additional transfer operation and the operation of reading from node S are carried out for all the pixels in a row before being successively repeated for the other rows of the array.

Further, although in the previously-described embodiments, MOS transistor T is a P-channel MOS transistor, it should be clear that the first and second operating modes may be implemented in the case where MOS transistor T is an N-channel transistor. In this case, substrate 10 and region 17 correspond to a lightly-doped N-type region, regions 19 and 20 are P-type doped regions, and upper portion 18 is a heavily-doped N-type region. In the first and second operating modes, regions 19 are maintained at a low potential, for example, at 0 V. Transistor T is maintained off by the setting of potential VTG at its gate to the low potential and is turned on by the setting of potential VTG at its gate to a high potential. In the first operating mode, potential Vwall applied to conductive core 16 is equal to the low potential. In the second operating mode, potential Vwall is maintained during the integration phase at a potential greater than the low potential, for example, at 1 V.

Finally, the practical implementation of the described embodiments and variations is within the abilities of those skilled in the art based on the functional indications given hereinabove. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The invention claimed is:

1. A semiconductor image sensor, the image sensor including a plurality of pixels, each pixel of the image sensor comprising a semiconductor substrate having opposite front and back sides and laterally delimited by a first insulating wall comprising a first conductive core insulated from the substrate, electron-hole pairs being capable of forming in the substrate due to a backside illumination, and a circuit configured to maintain, during a first phase and in a first operating mode, the first conductive core at a first potential and to maintain, during at least a portion of the first phase and in a second operating mode, the first conductive core at a second potential different from the first potential,
wherein the substrate is of P-type and has a first doping level and each pixel of the sensor further includes a second insulating wall penetrating into the substrate from the front side of the substrate, the second insulating wall being ring-shaped and delimiting a substantially central region including a lower portion continuing the substrate and an upper portion of P- type and having a second doping level greater than the first doping level, the second wall including a second conductive core insulated from the region.

2. The image sensor of claim 1, wherein the circuit is configured to maintain, during the first phase and in one of the first operating mode or the second operating mode, the second conductive core at a third potential, whereby a charge transfer from the substrate to the upper portion is blocked and, during a second phase, to maintain the second conductive core at a fourth potential, which results in the charge transfer from the substrate to the upper portion, and to maintain, during the first phase in the first operating mode, the first conductive core at the first potential which is equal to the third potential and to maintain, during the at least a portion of the first phase in the second operating mode, the first conductive core at the second potential which ranges from the third potential to the fourth potential.

3. The image sensor of claim 1, wherein the lower portion is at the first doping level.

4. The image sensor of claim 1, wherein the upper portion penetrates into the substrate from the front side less deeply than the second insulating wall.

5. A method of controlling a semiconductor image sensor, the image sensor including a plurality of pixels, each pixel of the sensor comprising a semiconductor substrate having opposite front and back sides and laterally delimited by a first insulating wall comprising a first conductive core insulated from the substrate, electron-hole pairs being capable of forming in the substrate due to a back-side illumination, the method comprising:
maintaining, during a first phase and in a first operating mode, the first conductive core at a first potential; and
maintaining, during at least a portion of the first phase and in a second operating mode, the first conductive core at a second potential different from the first potential,
wherein the substrate is of P-type and has a first doping level and each pixel of the sensor includes a second insulating wall penetrating into the substrate from the front side of the substrate, the second insulating wall being ring-shaped and delimiting a substantially central region including a lower portion continuing the substrate and an upper portion of P- type and having a second doping level greater than the first doping level, the second wall including a second conductive core insulated from the region.

6. The method of claim 5, comprising:
maintaining, during the first phase and in one of the first operating mode or the second operating mode, the second conductive core at a third potential, whereby a charge transfer from the substrate to the upper portion is blocked;
maintaining, during a second phase, the second conductive core at a fourth potential, which results in the charge transfer from the substrate to the upper portion;
maintaining, during the first phase in the first operating mode, the first conductive core at the first potential which is equal to the third potential; and
maintaining, during the at least a portion of the first phase in the second operating mode, the first conductive core at the second potential which ranges from the third potential, to the fourth potential.

7. The method of claim 6, comprising switching from the first operating mode to the second operating mode based on the conditions of illumination of the image sensor.

8. The method of claim 6, further comprising maintaining, for at least another portion of the first phase in the second operating mode, the first conductive core at the first potential which is equal to the third potential.

9. A pixel, comprising:
a semiconductor substrate having an opposing front side and back side, the semiconductor substrate configured to form photogenerated charges in the semiconductor substrate responsive to illumination of the back side of the semiconductor substrate;
a first insulating wall extending from the front side into the semiconductor substrate to laterally delimit the semiconductor substrate, the first insulating wall including a first conductive core insulated from the substrate and configured to receive, in a first phase and in a first operating mode, a first potential, and the first conductive core further configured to receive, for at least a portion of the first phase and in a second operating mode, a second potential different than the first potential; and
a second insulating wall extending into the semiconductor substrate from the front side, the second insulating wall laterally delimiting a central region of the semiconductor substrate and having a lower portion of P-type and a first doping level, and having an upper portion of P-type and having a second doping level greater than the first doping level.

10. The pixel of claim 9, wherein the second insulating wall includes a second conductive core insulated from the semiconductor substrate.

11. The pixel of claim 10, wherein the semiconductor substrate is of P-type and wherein the pixel further comprises regions of N-type in the substrate adjacent to the central region, each of the regions including at least one transistor.

12. The pixel of claim 10, wherein the second conductive core is configured to receive, in the first phase and in one of the first operating mode or the second operating mode, a third potential to block a transfer of the photogenerated charges from the lower portion to the upper portion of the central region of the semiconductor substrate.

13. The pixel of claim 12, wherein the second conductive core is further configured, in a second phase, to receive a fourth potential to transfer the photogenerated charges from the lower portion to the upper portion.

14. The pixel of claim 13, wherein the first conductive core is further configured, in the first phase and the first operating mode, to receive the first potential having a value that is equal to a value of the third potential.

15. The pixel of claim 14, wherein the first conductive core is further configured, in at least a portion of the first phase in the second operating mode, to receive the second potential having a value in a range greater than the value of the third potential to a value of the fourth potential.

16. A method of controlling a plurality of pixels of an image sensor, comprising:
applying to a first conductive core, during a first phase and in a first operating mode of the image sensor, a first voltage, each of the plurality of pixels of the image sensor including a portion of a semiconductor substrate having opposing first and second sides that are laterally delimited by a first insulating wall including the first conductive core insulated from the semiconductor substrate; and
applying to the first conductive core, during at least a portion of the first phase and in a second operating mode, a second voltage different from the first voltage,
wherein the substrate is of P-type and has a first doping level and each of the plurality of pixels includes a second insulating wall penetrating into the portion of the substrate from the front side, the second insulating wall laterally surrounding a central portion of the semiconductor substrate and having a lower portion continuing the portion of the substrate and an upper portion of P- type and having a second doping level greater than the first doping level, the second wall including a second conductive core insulated from the region.

17. The method of claim 16, further comprising applying a third voltage to the second conductive core the third voltage being applied to the second conductive core during the first phase and in one of the first operating mode or the second operating mode to block a transfer of photogenerated charges from the lower portion to the upper portion.

18. The method of claim 17, further comprising:
applying to the second conductive core, during a second phase, a fourth voltage to transfer photogenerated charges from the lower portion to the upper portion;
applying to the first conductive core, during the first phase in the first operating mode, the first voltage having a value that is equal to a value of the third voltage; and
applying to the first conductive core, during the at least a portion of the first phase in the second operating mode, the second voltage having a value that is greater than the third voltage and up to a value of the fourth voltage.

19. The method of claim 18, further comprising applying the first voltage to the first conductive core for at least another portion of the first phase in the second operating mode, the first voltage being equal to the third voltage.

20. The method of claim 16, wherein a switching from the first operating mode to the second operating mode is based on a condition of illumination of the plurality of pixels.

* * * * *

UNITED STATES PATENT AND TRADEMARK OFFICE
CERTIFICATE OF CORRECTION

PATENT NO. : 11,195,872 B2
APPLICATION NO. : 16/547231
DATED : December 7, 2021
INVENTOR(S) : Francois Roy et al.

It is certified that error appears in the above-identified patent and that said Letters Patent is hereby corrected as shown below:

In the Claims

Column 10, Claim 6, Line 19:
"potential, to the fourth potential." should read: -- potential to the fourth potential. --.

Column 12, Claim 17, Line 6:
"conductive core the third" should read: -- conductive core, the third --.

Signed and Sealed this
Tenth Day of May, 2022

Katherine Kelly Vidal
*Director of the United States Patent and Trademark Office*